United States Patent
Shibazaki

(10) Patent No.: US 10,593,514 B2
(45) Date of Patent: Mar. 17, 2020

(54) CHARGED PARTICLE BEAM IRRADIATION APPARATUS AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/574,280

(22) PCT Filed: Jun. 7, 2016

(86) PCT No.: PCT/JP2016/066825
§ 371 (c)(1),
(2) Date: Dec. 21, 2017

(87) PCT Pub. No.: WO2016/199738
PCT Pub. Date: Dec. 15, 2016

(65) Prior Publication Data
US 2018/0138011 A1 May 17, 2018

(30) Foreign Application Priority Data

Jun. 8, 2015 (JP) .................................. 2015-116160
Jun. 8, 2015 (JP) .................................. 2015-116161

(51) Int. Cl.
*H01J 37/30* (2006.01)
*H01L 21/027* (2006.01)
(Continued)

(52) U.S. Cl.
CPC ............ *H01J 37/3007* (2013.01); *G03F 7/20* (2013.01); *G03F 7/2059* (2013.01); *G03F 7/704* (2013.01);
(Continued)

(58) Field of Classification Search
CPC ....... H01J 37/305; H01J 37/3007; G03F 7/20; G03F 7/2059; G03F 7/704; H01L 21/027;
(Continued)

(56) References Cited

U.S. PATENT DOCUMENTS 3,899,728 A 8/1975 Hoppe
4,550,258 A 10/1985 Omata et al.
(Continued)

FOREIGN PATENT DOCUMENTS

JP S56-043157 U 4/1981
JP S61-294745 A 12/1986
(Continued)

OTHER PUBLICATIONS

Dec. 21, 2018 Extended Search Report issued in European Application No. 16807445.8.
(Continued)

*Primary Examiner* — Nicole M Ippolito
*Assistant Examiner* — Sean M Luck
(74) *Attorney, Agent, or Firm* — Oliff PLC

(57) ABSTRACT

An electron beam irradiation apparatus which exposes a wafer coated with an electron beam resist with an electron beam is equipped with: a stage that can be moved holding the wafer; an electron beam optical system that irradiates the wafer with an electron beam; and, an opening member, placed facing the wafer via a predetermined gap on the wafer side in the optical arrangement direction of the electron beam optical system, and having an opening through which the electron beam from the electron beam optical system passes.

42 Claims, 11 Drawing Sheets

(51) Int. Cl.
  *H01L 21/68* (2006.01)
  *H01L 21/687* (2006.01)
  *H01L 21/768* (2006.01)
  *H01J 37/305* (2006.01)
  *G03F 7/20* (2006.01)

(52) U.S. Cl.
  CPC .......... *H01J 37/305* (2013.01); *H01L 21/027* (2013.01); *H01L 21/68* (2013.01); *H01L 21/68764* (2013.01); *H01L 21/76894* (2013.01)

(58) Field of Classification Search
  CPC ............... H01L 21/68; H01L 21/68764; H01L 21/76894
  See application file for complete search history.

(56) References Cited

U.S. PATENT DOCUMENTS

| | | | |
|---|---|---|---|
| 5,528,034 A * | 6/1996 | Yamazaki | G01N 23/2258 250/288 |
| 6,545,274 B1 | 4/2003 | Morita | |
| 7,173,263 B2 | 2/2007 | Wieland et al. | |
| 7,561,280 B2 | 7/2009 | Schluchter et al. | |
| 2004/0079883 A1 | 4/2004 | Sugiura et al. | |
| 2006/0151721 A1 | 7/2006 | Nakasugi et al. | |
| 2007/0206170 A1 | 9/2007 | Ebihara | |
| 2007/0288121 A1 | 12/2007 | Shibazaki | |
| 2010/0001203 A1 * | 1/2010 | Nakayama | B82Y 10/00 250/397 |
| 2011/0053061 A1 | 3/2011 | Shibazaki | |
| 2011/0147609 A1 * | 6/2011 | Shichi | H01J 27/26 250/400 |
| 2013/0313430 A1 | 11/2013 | Ominami et al. | |
| 2015/0041672 A1 * | 2/2015 | Kamikubo | H01J 37/3177 250/397 |
| 2015/0325407 A1 * | 11/2015 | Mizoguchi | H01J 37/045 250/397 |

FOREIGN PATENT DOCUMENTS

| | | |
|---|---|---|
| JP | S62-287556 A | 12/1987 |
| JP | 2002-075826 A | 3/2002 |
| JP | 2004-104021 A | 4/2004 |
| JP | 2004-152505 A | 5/2004 |
| JP | 2011-258842 A | 12/2011 |
| JP | 2012-160267 A | 8/2012 |
| WO | 2007/017255 A1 | 2/2007 |
| WO | 2007/077920 A1 | 7/2007 |

OTHER PUBLICATIONS

Sep. 6, 2016 Written Opinion issued in International Patent Application No. PCT/JP2016/066825.

Sep. 6, 2016 International Search Report issued in International Patent Application No. PCT/JP2016/066825.

* cited by examiner

CHARGED PARTICLE BEAM IRRADIATION APPARATUS AND DEVICE MANUFACTURING METHOD

TECHNICAL FIELD

The present invention relates to a charged particle beam irradiation apparatus and a device manufacturing method, and more particularly to a charged particle beam irradiation apparatus that irradiates a target with a charged particle beam, and a device manufacturing method that uses the charged particle beam irradiation apparatus.

BACKGROUND ART

In an exposure apparatus used in a lithography process to produce electronic devices (micro devices) such as a semiconductor device that uses ultraviolet light from far ultraviolet region to vacuum ultraviolet region as an exposure beam (hereinafter called an ultraviolet light exposure apparatus), in order to increase resolution, shortening exposure wavelength, optimizing illumination conditions, applying a liquid immersion method to further increase numerical aperture of a projection optical system and the like have been performed.

In recent years, to form circuit patterns having a pitch finer than the resolution limit of the ultraviolet light exposure apparatus, an electron beam exposure apparatus has been proposed that forms spots smaller than the resolution limit of the ultraviolet light exposure apparatus with an electron beam and relatively scans this spot of the electron beam and a wafer (for example, refer to PTL 1).

However, in the conventional electron beam exposure apparatus, irradiation of the electron beam causes a charge-up in targets such as a wafer, and by the influence of the electrical charge accumulated on the surface, the electron beam could be adversely affected.

CITATION LIST

Patent Literature

[PTL 1] U.S. Pat. No. 7,173,263

SUMMARY OF THE INVENTION

According to a first aspect of the present invention, there is provided a charged particle beam irradiation apparatus irradiating a target with a charged particle beam, comprising: a stage holding the target that can be relatively moved with respect to the charged particle beam; a charged particle beam optical system irradiating the target with the charged particle beam; and a charged particle detection device arranged at an emitting side of the charged particle beam of the charged particle beam optical system and in the periphery of the charged particle beam, to detect the charged particle beam.

According to a second aspect of the present invention, there is provided a charged particle beam irradiation apparatus irradiating a target with a charged particle beam, comprising: a stage, holding the target that can be relatively moved with respect to the charged particle beam; a charged particle beam optical system, irradiating the target with the charged particle beam; and an opening member arranged at an emitting side of the charged particle beam of the charged particle beam optical system, having an opening formed, through which the charged particle beam passes.

According to a third aspect of the present invention, there is provided a device manufacturing method, including: irradiating the substrate using the charged particle beam irradiation apparatus according to one of the first and the second aspect, and developing the substrate that has been irradiated.

DESCRIPTION OF EMBODIMENTS

First Embodiment

Figure 1:
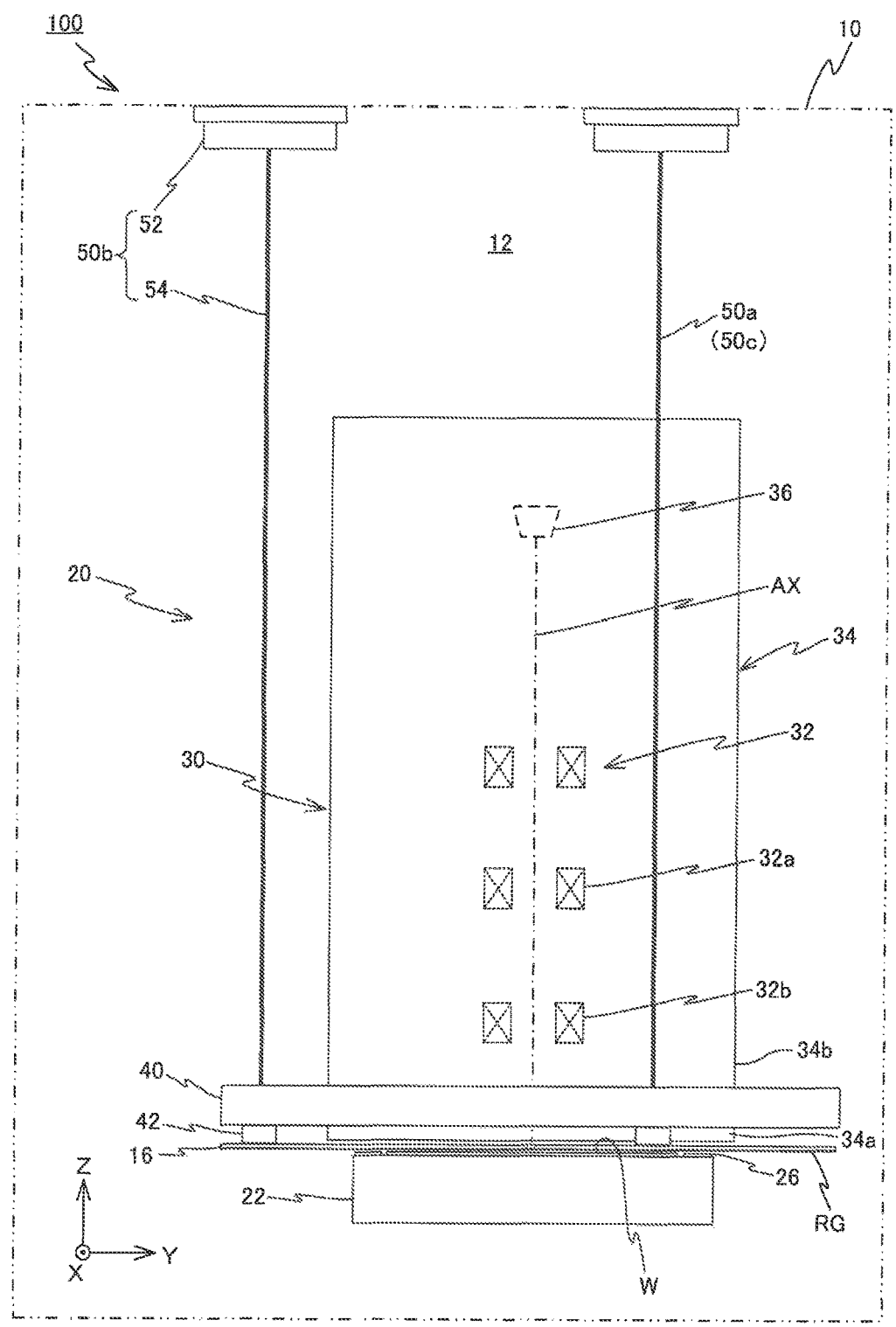
FIG. 1 is a view schematically showing a structure of an electron beam exposure apparatus 100 according to a first embodiment.

Hereinafter, a first embodiment will be described, based on FIGS. 1 to 8. FIG. 1 schematically shows a structure of an electron beam exposure apparatus 100 according to the first embodiment. Electron beam exposure apparatus 100 is equipped with an electron beam optical system to be described later on; therefore, the description below will be made with a Z-axis being parallel to the optical axis of the electron beam optical system, and a Y-axis and an X-axis being orthogonal to each other in a plane perpendicular to the Z-axis.

In the embodiment, as an example of a charged particle beam, a structure using an electron beam will be described. The charged particle beam, however, is not limited to the electron beam, and may be a beam using a charged particle such as an ion beam.

Electron beam exposure apparatus 100 is equipped with a vacuum chamber 10, and an exposure system 20 housed inside an exposure chamber 12 divided by vacuum chamber 10.

Exposure system 20, as is shown in FIG. 1, is equipped with a stage 22 movable holding a wafer W, and an electron beam irradiation device 30 that has an electron beam optical system 32 which irradiates wafer W coated with a resist for electron beams (sensitive agent) with an electron beam.

Stage 22 is moved with predetermined strokes in an X-axis direction and a Y-axis direction on a base member (not shown) by a stage drive system 24 (not shown in FIG. 1, refer to FIG. 7) including a linear motor or the like, and is also finely moved in a Z-axis direction, a rotation direction around the X-axis (θx direction), a rotation direction around the Y-axis (θy direction), and a rotation direction around the Z-axis (θz direction). To suppress the irradiation position of the electron beam emitted from electron beam irradiation device 30 on wafer W from moving (displacement) by variation of magnetic field caused by the linear motor or the like as much as possible, a magnetic shield is applied to the linear motor, and magnetic flux leakage from the linear motor to the wafer side is effectively suppressed or prevented.

Electron beam irradiation device 30, as is shown in FIG. 1, has a barrel 34. This barrel 34 is formed in a cylindrical shape. Barrel 34 has an electron beam emitting section 34a, a main section 34b that houses an electron gun section and an electromagnetic lens to be described later on, and a step section (flange section) arranged in between the electron beam emitting section 34a and main section 34b. Barrel 34 is supported from below by a metrology frame 40 consisting of an annular plate member. To be more specific, electron beam emitting section 34a of barrel 34 is formed by a small diameter section whose diameter is smaller than main section 34b, and the small diameter section is inserted into a circular opening in metrology frame 40 so that barrel 34 is supported from below by metrology frame 40 in a state where the bottom surface of the step section is in contact with the upper surface of metrology frame 40.

Metrology frame 40 has, to the outer periphery section, each of the lower end of three suspension support mechanisms 50a, 50b, and 50c serving as connecting members having a flexible structure (however, suspension support mechanism 50c in FIG. 1 is hidden in the depth of 50a) connected, arranged apart at a center angle of 120 degrees, and is supported in a suspended state from a top plate (ceiling wall) of vacuum chamber 10 that divides exposure chamber 12 via suspension support mechanisms 50a, 50b, and 50c. That is, in the manner described above, electron beam irradiation device 30 is supported by suspension at three points with respect to vacuum chamber 10.

The three suspension support mechanisms 50a, 50b, and 50c, as is representatively shown in suspension support mechanism 50a in FIG. 1, each has a passive vibration isolation pad 52 provided at the upper end of each of the suspension support mechanisms, and a wire 54 made of steel having one end connected to the lower end of vibration isolation pad (vibration isolation section) 52 and the other end connected to metrology frame 40. Vibration isolation pad 52 is fixed to the top plate of vacuum chamber 10, and each includes an air damper or a coil spring.

In the embodiment, of vibration such as floor vibration transmitted from the outside to vacuum chamber 10, since a large part of the vibration component in the Z-axis direction parallel to an optical axis AX of electron beam optical system 32 is absorbed by vibration isolation pad 52, high vibration isolation performance can be obtained in the direction parallel to optical axis AX of electron beam optical system 32. Also, natural frequency of suspension support mechanisms 50a, 50b, and 50c is lower in a direction perpendicular to optical axis AX than in the direction parallel to optical axis AX of electron beam optical system 32. Since the three suspension support mechanisms 50a, 50b, and 50c vibrate like a pendulum in the direction perpendicular to optical axis AX the length (length of wire 54) of the three suspension support mechanisms 50a, 50b, and 50c is set long enough so that the vibration isolation performance (capacity of preventing vibration such as floor vibration transmitted from the outside to vacuum chamber 10 from traveling to electron beam irradiation device 30) in the direction perpendicular to optical axis AX becomes sufficiently high. In this structure, while high vibration isolation performance can be obtained along with being able to largely reduce the weight of the mechanism section, relative position between electron beam irradiation device 30 and vacuum chamber 10 may change at a comparatively low frequency. Therefore, in order to maintain the relative position between electron beam irradiation device 30 and vacuum chamber 10 to a predetermined state, a positioning device 14 (not shown in FIG. 1, refer to FIG. 7) of a non-contact method is provided in between electron beam irradiation device 20 and vacuum chamber 10. This positioning device 14 can be structured including a six-axis acceleration sensor and a six-axis actuator, as is disclosed in, for example, International Publication WO 2007/077920, and the like. Positioning device 14 is controlled by a controller 60 (refer to FIG. 7). This allows the relative position of electron beam irradiation device 30 in the X-axis direction, the Y-axis direction, the Z-axis direction and relative rotation angle around the X-axis, the Y-axis, and the Z-axis with respect to vacuum chamber 10 to be maintained at a constant state (a predetermined state).

Electron beam irradiation device 30, as is shown in FIG. 1, includes parts such as an electron gun section 36 partly provided inside barrel 34 that generates electrons and performs acceleration by an acceleration power supply (not shown) to form an electron beam EB (refer to FIG. 2), and an electron beam optical system 32 arranged in a predetermined positional relation inside barrel 34 that is structured of various electrodes and the like such as an electromagnetic lens and an aperture used to perform forming of spots of electron beam EB, adjustment of irradiation position of electron beam EB with respect to wafer W, adjustment of irradiation amount and the like. Electromagnetic lens includes an electromagnetic lens that has a focus coil (hereinafter referred to as a focus lens for convenience), an electromagnetic lens that has a deflection coil (hereinafter referred to as a deflection lens for convenience) and the like.

Figure 7:
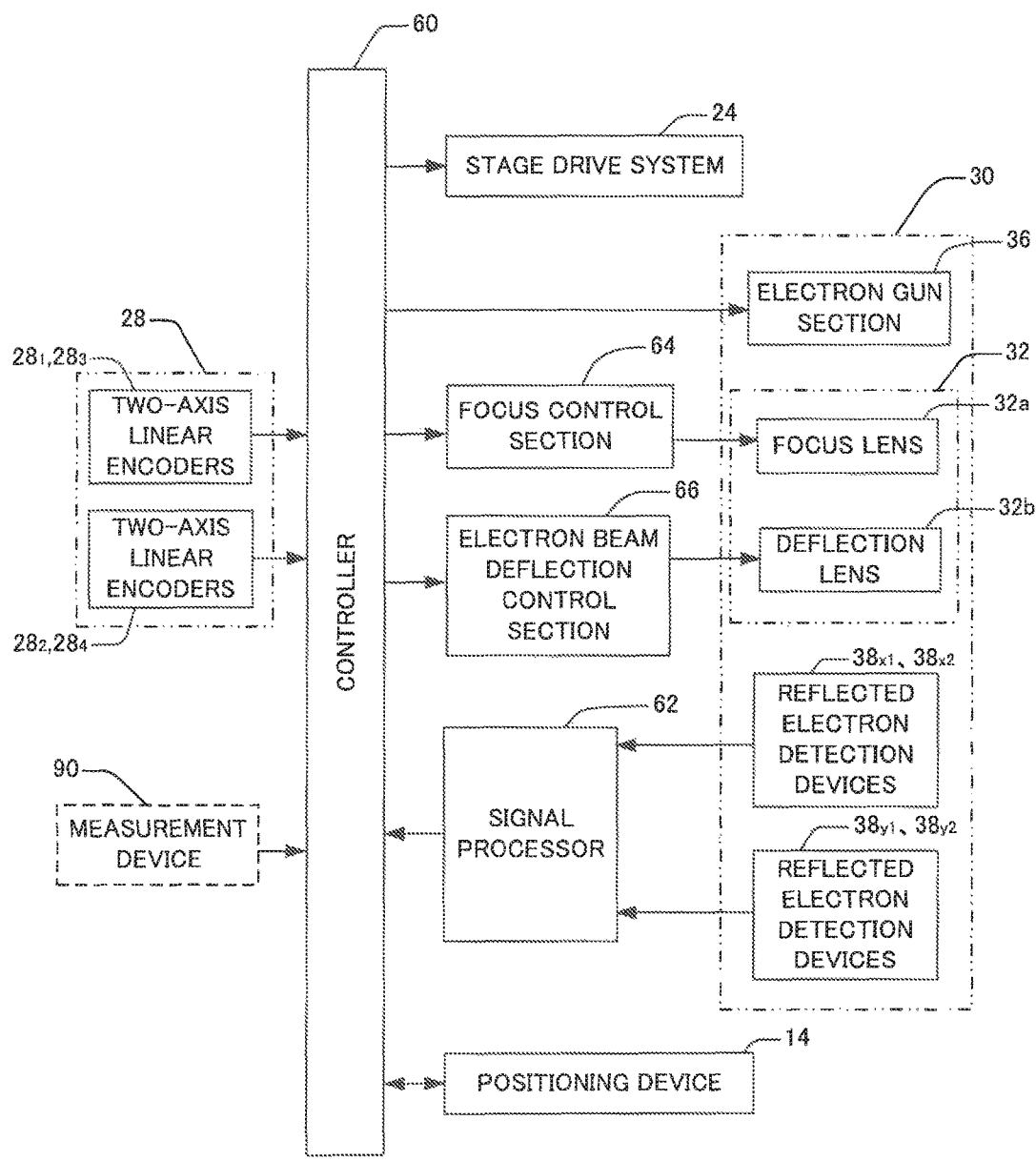
FIG. 7 is a block diagram showing an input-output relation of a controller that structures a control system of the electron beam exposure apparatus.

FIG. 1 representatively shows a focus lens 32a and deflection lens 32b that structure electron beam optical system 32. As is shown in FIG. 7, focus lens 32a is controlled by controller 60 via a focus control section 64, and deflection lens 32b is controlled by controller 60 via an electron beam deflection control section 66.

In the embodiment, electron beam optical system 32 consists of a multi-beam optical system that can be separately turned on/off and can irradiate n (n is, for example, 500) deflectable beams. As the multi-beam optical system, a system can be used that has a structure similar to the optical system disclosed in, for example, Japanese Unexamined Patent Application Publication No. 2011-258842, International Publication WO 2007/017255, and the like. As an example, when the 500 multi-beams arranged in a line in a lateral direction (X direction) are all in an on state (a state in which wafer W is irradiated with the electron beams), circular spots of the electron beams are formed simultaneously at 500 points set at an equal spacing within, for example, a 10 μm×20 nm exposure area (a slit shaped area extending in the X direction). That is, one exposure area is formed with 500 electron beams. Note that the circular spot of the electron beam is formed having a diameter (e.g. a diameter of 20 nm) smaller than the resolution limit of the ultraviolet light exposure apparatus.

In the embodiment, by electron beam optical system 32 forming spots of multiple (n=500) electron beams in a circular shape as is described above, arranging the circular spots in an exposure area, and also turning on/off the circular spots of the multiple electron beams while deflecting the circular spots, while moving stage 22 in a predetermined direction, e.g. Y-axis direction, in predetermined strokes at a constant speed so that wafer W is scanned with respect to the exposure area, a part of a shot area on the wafer, that is, a strip-shaped shot area having a width of 10 μm is exposed (scanning exposure). And, by repeatedly performing an alternate scanning operation in which the scanning exposure is performed alternately in the +Y direction and the −Y direction and a stepping operation in which wafer W (stage 22) is moved by a distance the same as the size of the exposure area in the X-axis direction to one side of the X-axis direction in deceleration and acceleration zones of wafer W (stage 22) in the Y-axis direction in order to change the scanning direction in the alternate scanning, the pattern is formed on the shot areas on the wafer.

Electron beam irradiation device 30 is equipped with a reflected electron detection device to be described later on that detects reflected electrons. Electron beam irradiation device 30 is controlled by controller 60 (refer to FIG. 7).

Controller 60 can deflect and scan electron beam EB by controlling deflection lens 32b. Note that the range that electron beam EB can be scanned by deflection lens 32b can be decided by the deflectability of deflection lens 32b. For example, the scanning range of electron beam EB can be set smaller than at least the radius of barrel 34.

In electron beam exposure apparatus 100, on a −Z side of electron beam irradiation device 30 (electron beam optical system 32) and also on the +Z side of wafer W held by stage 22 in the Z-axis direction, that is, on the electron beam emitting side of electron beam irradiation device 30, an opening member 16 is arranged. Opening member 16 is arranged, for example, parallel to an XY plane, which is a surface intersecting the optical axis of electron beam optical system 32, and is supported in a suspended state from metrology frame 40 via a plurality of (at least three) support members 42. Opening member 16 has strength strong enough to maintain flatness in a state supported by the plurality of support members 42.

Figure 2:
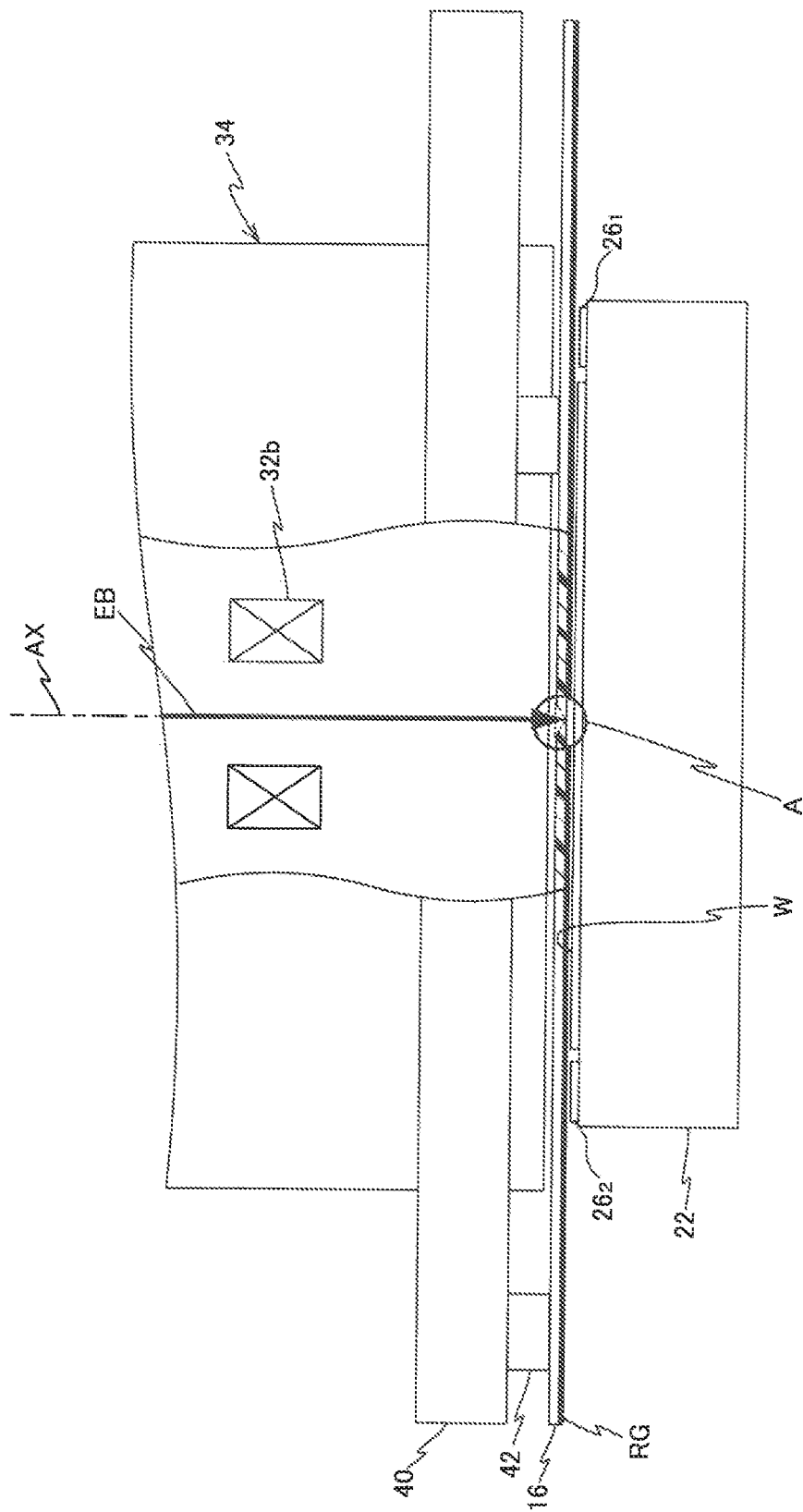
FIG. 2 is an enlarged view of a lower end of a barrel, a metrology frame, and an opening member in FIG. 1 partly broken, along with a stage.
Figure 3A:
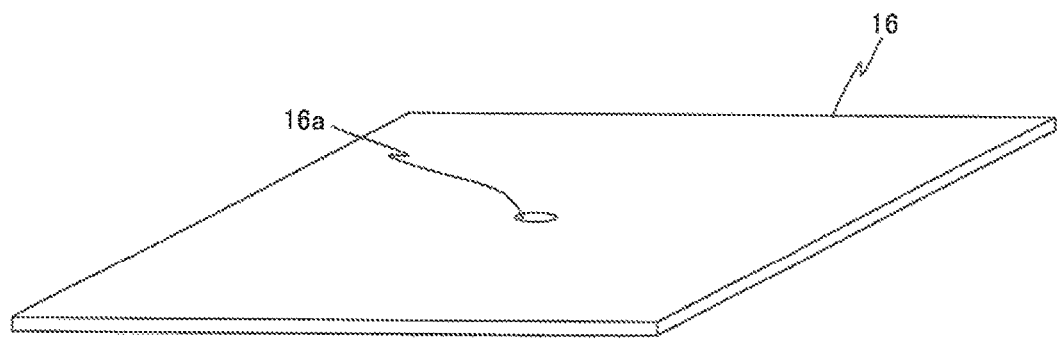
FIG. 3A is a perspective view when viewing the opening member from above obliquely.
Figure 3B:
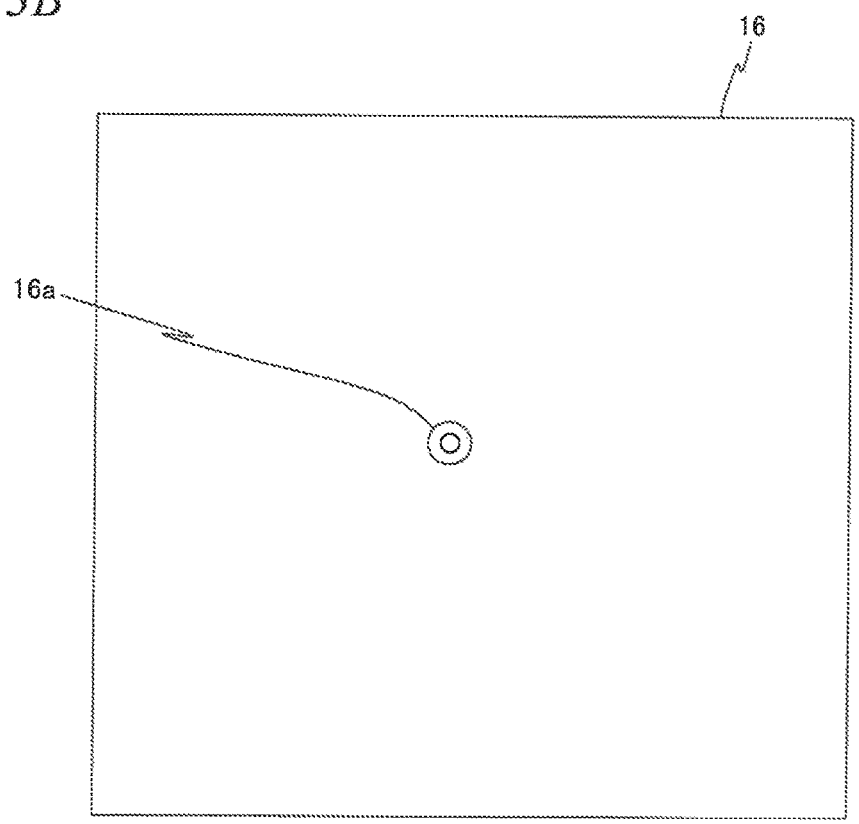
FIG. 3B is a planar view of the opening member.
Figure 4:
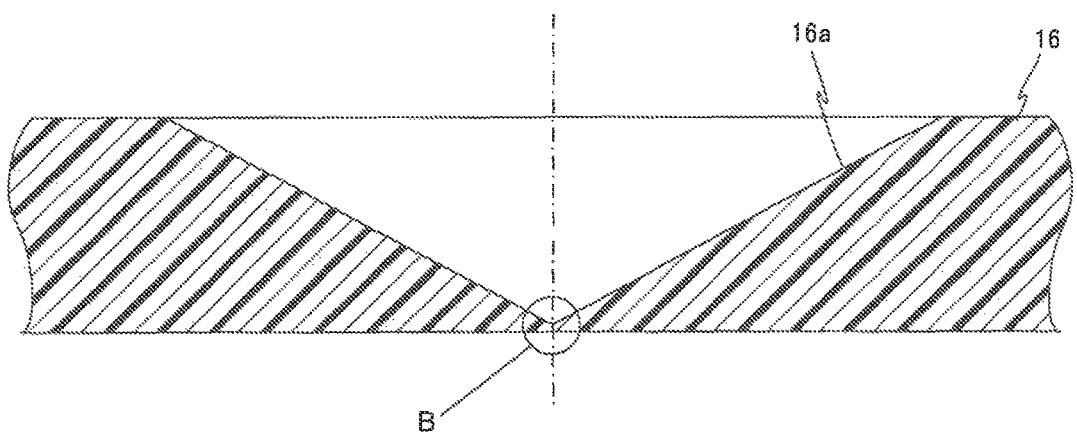
FIG. 4 is an enlarged view of the part circle A shown in FIG. 2 of the opening member.

FIG. 2 shows an enlarged view of the lower end of barrel 34, metrology frame 40, and opening member 16 in FIG. 1 in a state partly broken, along with stage 22. Also, FIGS. 3A and 3B show a perspective view of opening member 16 when viewed from above obliquely and a planar view, respectively. Also, FIG. 4 shows the part of circle A in FIG. 2 of opening member 16 enlarged, and FIG. 5 shows the part of circle B in FIG. 4 enlarged.

Opening member 16, as is shown in FIGS. 3A and 3B, consists of a plate member having a shape almost a square, and a conical recess section 16a is formed in the center. Conical recess section 16a is formed so that the size of the opening gradually becomes smaller from the upper surface (electron beam optical system 32) side of opening member 16 towards the lower surface (wafer W) side. As the material of opening member 16, for example, a dielectric is used. Note that in the embodiment, as opening member 16, a dielectric material also having a low thermal expansion coefficient such as, e.g. a zero expansion ceramic, is used.

Figure 5:
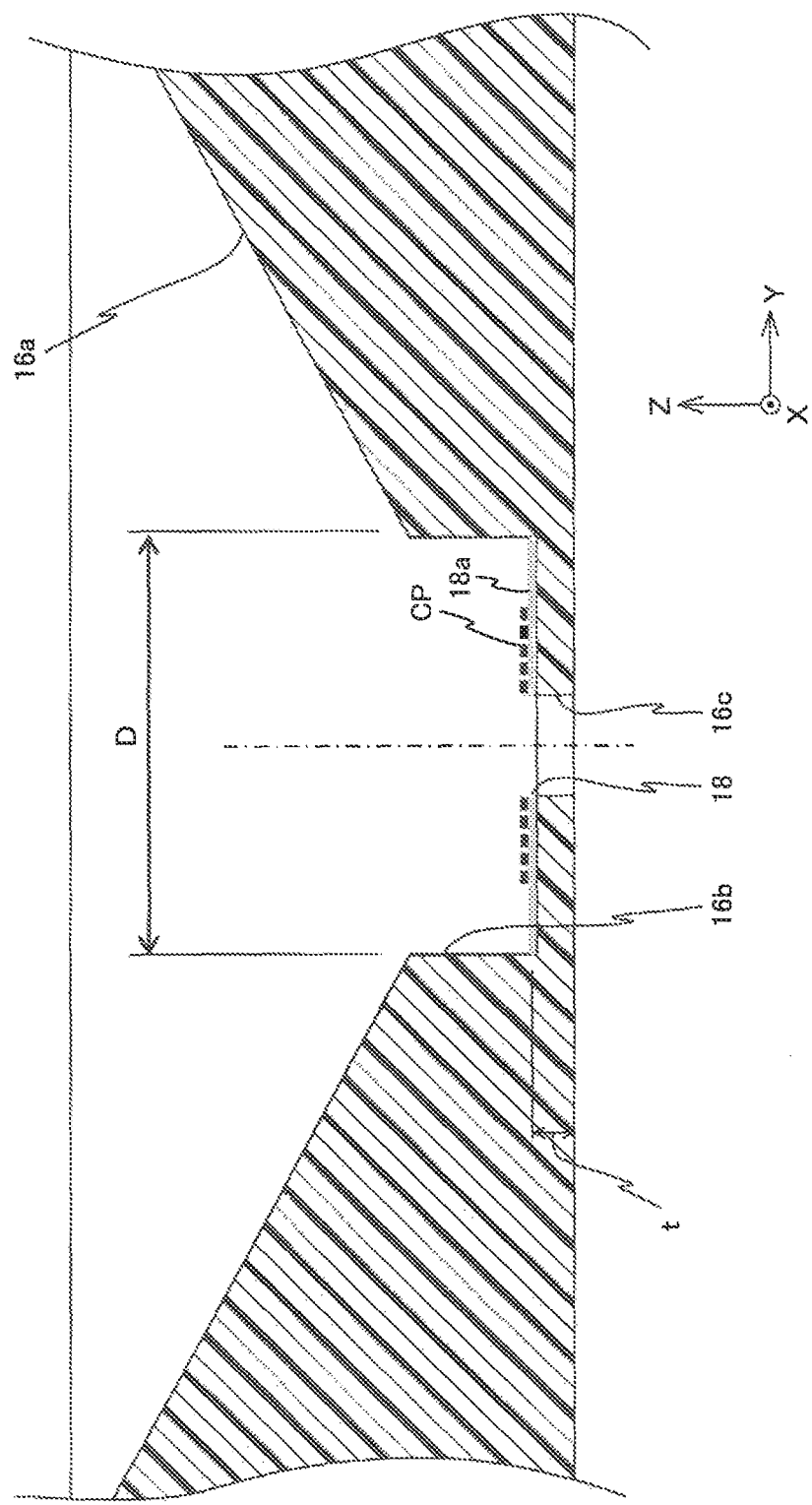
FIG. 5 is an enlarged view of the part circle B shown in FIG. 4.

In the center of recess section 16a, as is shown in FIG. 5, an engraved recess section 16b of a circular cross section having, for example, a diameter D of about 100 μm to 200 μm is formed, and in the center of the bottom wall section of engraved recess section 16b, a fine rectangular slit (or a circle) shaped opening 16c is formed. Opening 16c is slightly larger than an exposure field, having a size of about 30 μm.

On the upper surface of the bottom wall of engraved recess section 16b, a metal reflection film 18 is provided, and on the upper surface of reflection film 18, a reflection surface 18a is formed. In other words, reflection surface 18a is provided around opening 16c. Also, the upper surface of the bottom wall is provided to face electron beam optical system 32. On reflection surface 18a at both sides of opening 16c in a first direction (the Y-axis direction in FIG. 5), a calibration pattern consisting of a line-and-space pattern whose periodic direction is in the first direction is formed, and on reflection surface 18a at both sides of opening 16c in a second direction (a direction orthogonal to the first direction, the X-axis direction in FIG. 5), a calibration pattern CP (in FIG. 5 and the like, only Y calibration pattern CP whose periodic direction is on the Y-axis direction is shown) consisting of a line-and-space pattern whose periodic direction is in the second direction is formed. Calibration pattern CP each has different reflectance in the line section and the space section. In FIG. 5 and the like, calibration pattern CP shown is made much thicker than the actual size of thickness for convenience of explanation.

Thickness t of the bottom wall (including the thickness of reflection film 18) of engraved recess section 16b on which reflection film 18 and calibration pattern CP are formed is desirably as thin as possible. In the embodiment, the thickness of the bottom wall of engraved recess section 16 is set, as an example, to about 10 μm to 50 μm.

Note that in the embodiment, while reflection surface 18a is a plane parallel to the XY plane, the embodiment is not limited to this, and may be a curved surface that has an arc shape in a side view whose center is on the optical axis of electron beam optical system 32, or may be an inclined surface corresponding thereto. Also, reflection surface 18a may be formed separated in the first direction (Y-axis direction) and the second direction (X-axis direction).

Figure 6:
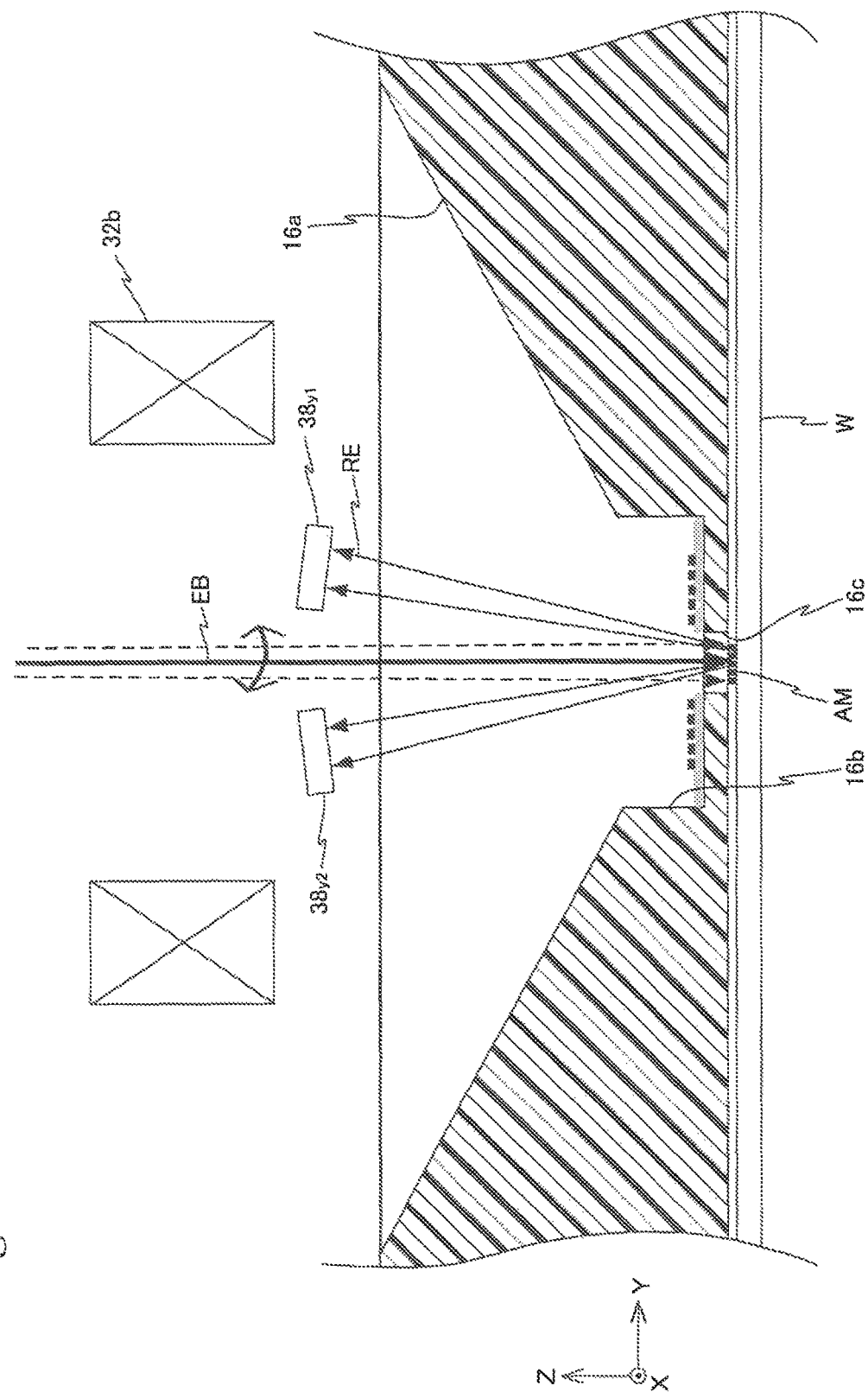
FIG. 6 is a view showing an arrangement of a reflected electron detection device, along with a view showing a state of detection of reflected electrons from alignment marks.

Returning to the former subject of the description, inside barrel 34, as is shown in FIG. 6, a plurality of reflected electron detection devices 38 is provided near the lower end of deflection lens 32b of electron beam optical system 32. In other words, the plurality of reflected electron detection devices 38 is arranged on the emitting side of deflection lens 32b and also at the periphery of charged particle beams. Note that the periphery of charged particle beams refers to the range in which electron beams EB can be scanned by deflection lens 32b as is previously described.

Each of the plurality of reflected electron detection devices 38 is structured, for example, by a semiconductor detector, and sends detection signals corresponding to reflected electrons which are detected to a signal processor 62 (refer to FIG. 7). Signal processor 62, after amplifying the detection signals of the plurality of reflected electron detection devices 38 with an amplifier (not shown), performs signal processing and sends the processing results to controller 60 (refer to FIG. 7).

Each of the plurality of reflected electron detection devices 38, as is shown in FIG. 6, is provided at a position where reflected electrons generated at an alignment mark AM that enters barrel 34 via opening 16c and the inner space of engraved recess section 16b can be detected when alignment mark AM on wafer W is irradiated with electron beam EB via the inner space of engraved recess section 16b and opening 16c of opening member 16. Alignment mark AM formed on wafer W is formed by a two-dimensional mark including a line-and-space pattern whose periodic direction is in the Y-axis direction (the first direction) and a line-and-space pattern whose periodic direction is in the X-axis direction (the second direction). Although FIG. 6 only shows a pair of reflected electron detection devices $38_{y1}$ and $38_{y2}$ that detects reflected electrons generated in a direction tilted with respect to the optical axis within a YZ plane from alignment mark AM on wafer W, a pair of reflected electron detection devices $38_{x1}$ and $38_{x2}$ that detects reflected electrons generated in a direction tilted with respect to the optical axis within an XZ plane from alignment mark AM is also actually provided (refer to FIG. 7). In the embodiment, reflected electron detection devices $38_{x1}$, $38_{x2}$, $38_{y1}$, and $38_{y2}$ are also used when performing calibration of beam position to be described later on.

Position information of stage 22 is measured by an encoder system 28 (refer to FIG. 7). Encoder system 28, as is shown in FIG. 2, is formed in an area excluding a section at the rear surface side of recess section 16a at the lower surface (surface on the −Z side) of opening member 16, and consists of a grating RG consisting of a reflection type two-dimensional grating whose periodic directions are in the X-axis direction and the Y-axis direction and four heads 26 (hereinafter described as heads $26_1$ to $26_4$ for convenience) with one head arranged at one corner of the four corners of stage 22 facing grating RG.

As the reflection type two-dimensional grating, a reflective diffraction grating having a pitch of, e.g. 1 μm, for each of the periodic directions is used. Note that as grating RG, a grating structured of four sections that can individually face the four heads 26 may be used, as is disclosed in, for example, U.S. Patent Application Publication No. 2011/0053061.

Of the two diagonal lines of stage 22, near the two corners located on one of the diagonal lines, heads $26_1$ and $26_3$ are provided whose measurement directions are in the X-axis direction and the Z-axis direction, and near the two corners located on the other diagonal line, heads $26_2$ and $26_4$ are provided whose measurement directions are in the Y-axis direction and the Z-axis direction. The four heads $26_1$ to $26_4$ are arranged at each of the vertex positions of the same square or rectangle in a planar view. FIG. 2 shows only two heads $26_1$ and $26_2$ of the four heads.

Heads $26_1$ and $26_3$ make up two-axis linear encoders $28_1$ and $28_3$, respectively, which irradiate grating RG with a beam and measure position information of stage 22 in the X-axis direction and the Z-axis direction. Also, heads $26_2$ and $26_4$ make up two-axis linear encoders $28_2$ and $28_4$, respectively, which irradiate grating RG with a beam and measure position information of stage 22 in the Y-axis direction and the Z-axis direction.

As each of the heads $26_1$ to $26_4$, an encoder head having a structure similar to a displacement measurement sensor head disclosed in, for example, U.S. Pat. No. 7,561,280 can be used.

The four two-axis linear encoders $28_1$ to $28_4$ described above, that is, the four heads $26_1$ to $26_4$ which measure position information of stage 22 using each grating RG structure encoder system 28. Position information measured by encoder system 28 is supplied to controller 60 (refer to FIG. 7).

In encoder system 28, at least three of the four heads $26_1$ to $26_4$ faces grating RG at all times when stage 22 is in an area where exposure and alignment to wafer W is performed, therefore, controller 60 can measure the position of stage 22 (wafer W) in directions of six degrees of freedom (in each of the X-axis, the Y-axis, the Z-axis, the θx, the θy, and the θz directions), based on the information measured by encoder system 28.

FIG. 7 is a block diagram showing an input-output relation of controller 60 which structures a control system of electron beam exposure apparatus 100. Controller 60 includes a microcomputer and the like, and has overall control over each section of electron beam exposure apparatus 100 including the sections shown in FIG. 7.

In electron beam exposure apparatus 100 structured in the manner described above, controller 60 controls electron beam EB emitted from electron beam optical system 32 and stage 22 according to a predetermined pattern data and each drawing parameter decided in advance, and performs exposure (pattern drawing) with respect to wafer W.

Now, in order to complete a micro device such as a semiconductor device, a plurality of layers of patterns has to be overlaid and formed on a wafer, which makes overlay between an underlayer pattern and a pattern to be drawn important.

Therefore, in the embodiment, prior to pattern drawing (exposure of the wafer) with respect to the wafer, by controller 60 controlling deflection lens 32b via electron beam deflection control section 66, electron beam EB is sequentially scanned with respect to two or more alignment marks AM (refer to FIG. 6) formed in advance on the wafer, and on this scanning, reflected electrons generated from alignment marks AM are detected by reflected electron detection device 38. At the time of scanning with respect to alignment marks AM, accelerating voltage of electron beam EB is set to the same accelerating voltage as the time of exposure (the time of pattern drawing).

FIG. 6, as an example, shows reflected electrons RE of electron beam EB irradiated on alignment marks AM along an optical path (an optical path indicated by a solid line in the drawing) parallel to the optical axis, moving toward reflected electron detection devices $38_{y1}$ and $38_{y2}$ from alignment marks AM. Controller 60 specifies the position of alignment marks AM based on deflection information (information including deflection angle, deflection direction and the like) of the electron beam obtained from electron beam deflection control section 66 and processing results of detection signals of the marks obtained from signal processor 62, and based on the position and stage coordinate information obtained from encoder system 28 at the time of detection, acquires the position of alignment marks AM on a stage coordinate system. Based on the position on the stage coordinate system of the two or more alignment marks acquired in this manner, target position information for positioning the shot areas on the wafer to an exposure position (irradiation position in a reference state of the electron beam, that is, irradiation position of electron beam SB on wafer W when electron beam EB is irradiated along the optical path indicated by the solid line in FIG. 6 on optical axis AX) can be acquired. Then, based on the target position information that has been obtained, controller 60 draws the pattern while moving the wafer (stage 22) at the time of exposure of the wafer (at the time of pattern drawing with respect to the wafer). By using alignment marks AM as a reference as is described, the pattern can be drawn at a desired position at all times, and a new pattern to be drawn can be overlaid favorably on the pattern which has already been formed on wafer W.

However, while using electron beam exposure apparatus 100, when the position of electron beam EB drifts from the reference state, for example, drifts from a state where the optical path of electron beam EB coincides with optical axis AX of electron beam optical system 32 due to, for example, thermal expansion and the like of barrel 34 housing electron beam optical system 32, even if exposure (pattern drawing) with respect to the wafer by electron beam EB is performed with alignment marks AM serving as a reference as is described above, the pattern cannot be drawn at a desired position due to the drift. Also, drift of focus of electron beam EB also becomes a cause of defective exposure.

Therefore, in the embodiment, controller 60 performs initial setting for calibration of drift (position and focus) of electron beam EB at the time of alignment measurement before starting exposure, prior to measuring mark position information of alignment marks AM.

Controller 60 sets the position of wafer W in the Z-axis direction to the same position as the time of exposure and scans alignment marks AM while changing focal position by changing current of a focus coil that focus lens 32a described earlier has via focus control section 64, and from a change in detection signals of reflected electron detection device 38 (a predetermined one among $38_{x1}$, $38_{x2}$, $38_{y1}$, and $38_{y2}$) that has detected reflected electron RE, the position where the change is sharpest is acquired as the optimum focal position, and the current corresponding to the optimum focal position is to be supplied thereafter to the focus coil.

Figure 8:
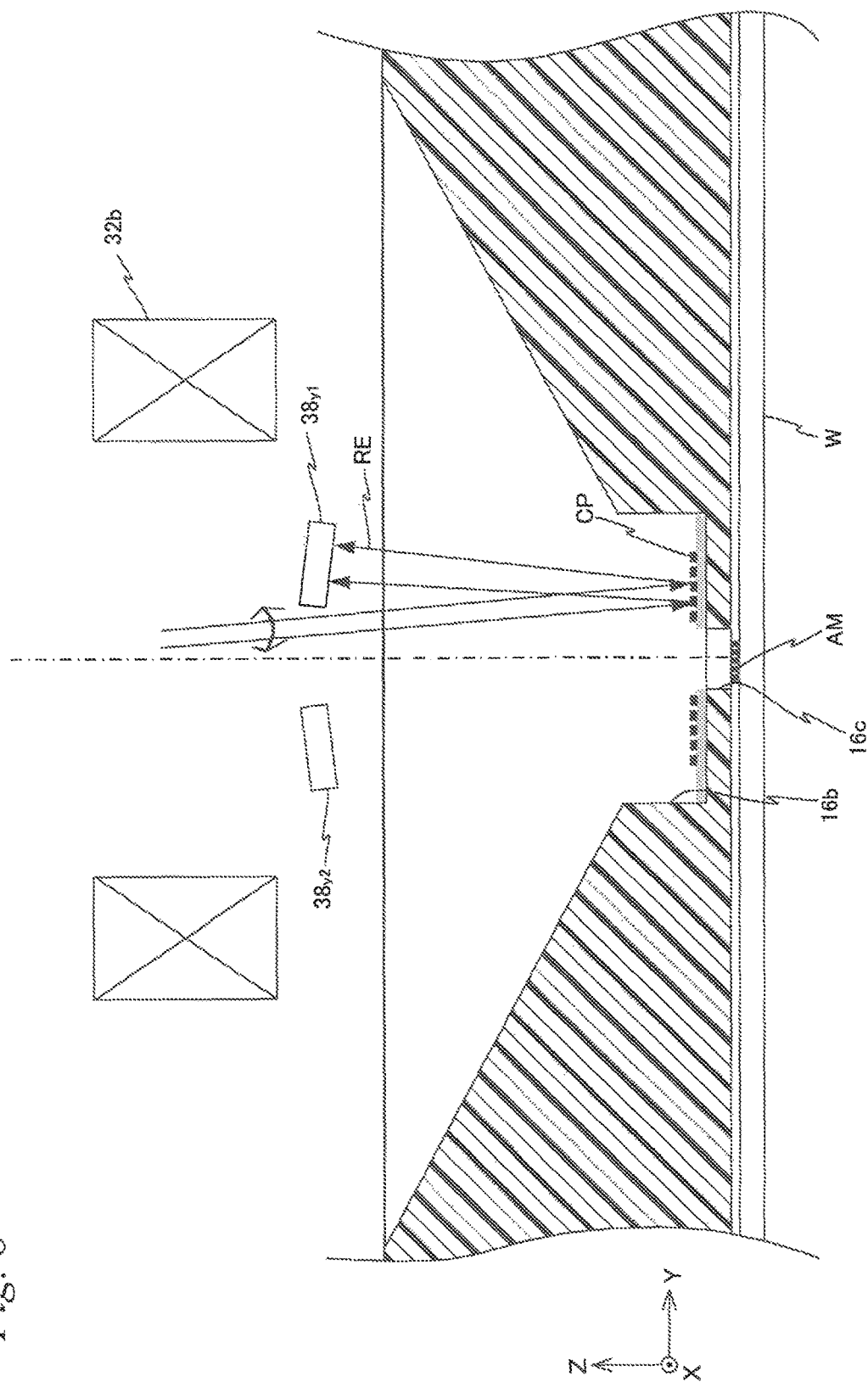
FIG. 8 is a view showing a state where reflected electrons RE are detected using reflected electron detection device $38_{y1}$ when acquiring positions of calibration patterns on a reflection surface, positioned at the +Y side of opening 16c.

Next, controller 60 deflects and scans electron beam EB with respect to the four calibration patterns CP on reflection surface 18a and detects reflected electrons from each of the calibration patterns CP using reflected electron detection devices $38_{x1}$, $38_{x2}$, $38_{y1}$, and $38_{y2}$, and based on deflection information of electron beam EB obtained from electron beam deflection control section 66 and information on processing results of detection signals of calibration patterns CP obtained from signal processor 62, position (hereinafter referred to as position information of calibration patterns CP) of calibration patterns CP with the position of electron beam EB in the reference state serving as a reference, that is, information on the amount of angle that electron beam EB should be deflected in each of the X direction and the Y direction from the reference state or on the direction of deflection so that the center position of each of the calibration patterns CP is made to be irradiated with electron beam SB is to be acquired. FIG. 8, as an example, shows a state where reflected electrons RE are detected using reflected electron detection device $38_{y1}$ when acquiring position information of calibration pattern CP on the reflection surface positioned at the +Y side of opening 16c. Here, as is obvious from the position information of calibration pattern CP defined above, in the case the position information of the calibration pattern has changed later on from the position information at the time of the initial setting, this means that the position of the electron beam has drifted according to the amount of change. Drift includes deviation of deflection angle, shift of deflection direction, and shift with respect to optical axis AX. Also, controller 60 functions as a detection device that detects the drift.

On this operation, controller 60 stores the state of change of detection signals of a predetermined one reflected electron detector that has detected reflected electrons from calibration patterns CP, such as, for example, reflected electron detection device $38_{y1}$, in an internal memory. This is because controller 60 detects the drift of focus of electron beam EB later on, using the state of change of detection signals as a reference. Note that all reflected electron detection devices may have the state of change of detection signals stored in the internal memory.

This completes the initial setting for calibration of drift (position and focus) of electron beam EB.

After this, measurement (alignment measurement) of mark position information of alignment marks AM described earlier is performed.

Then, controller 60 acquires the target position information to position the shot areas on the wafer at the exposure position as is previously described based on results of the alignment measurement, and at the time of exposure on the wafer (at the time of pattern drawing with respect to the wafer), draws the pattern while moving the wafer (stage 22) based on the acquired target position information. This wafer exposure (pattern drawing), as is described earlier, is performed, by repeating the alternate scanning operation in which scanning exposure of the wafer is performed alternately in the +Y direction and the −Y direction and the operation (stepping operation) of moving the wafer by a distance the same as the width of the exposure area in the X-axis direction to one side of the X-axis direction during deceleration and acceleration of the wafer in the Y-axis direction between scanning in the +Y direction (plus scan) and scanning in the −Y direction (minus scan).

However, since the size of the exposure area in a non-scanning direction (the X-axis direction) of electron beam exposure apparatus 100 is about, e.g. 50 μm, the alternate scanning operation has to be repeated many times in order to expose one wafer or one exposure area, the exposure operation takes much more time than the ultraviolet light exposure apparatus and the like. Therefore, the calibration of drift (position and focus) of electron beam EB has to be performed even while exposing one wafer.

Therefore, in electron beam exposure apparatus 100, each time the stepping operation described earlier is performed, during the stepping operation, controller 60 deflects and scans electron beam EB with respect to the four calibration patterns CP on reflection surface 18a and detects reflected electrons RE generated from each of the calibration patterns CP using reflected electron detection devices $38_{x1}$, $38_{x2}$, $38_{y1}$, and $38_{y2}$, similar to the time of initial setting for calibration previously described. Then, controller 60 acquires position information of calibration patterns CP based on deflection information of the electron beam obtained from electron beam deflection control section 66 and information on processing results of detection signals of calibration patterns CP obtained from the signal processor, and stores the information in memory.

Then, controller 60 calculates the position of calibration patterns CP according to a procedure decided in advance, based on position information of calibration pattern CP obtained N times (N is a natural number, e.g. 10 times). For example, an average of the remaining position information which is information excluding from the 10 times the position that has changed maximum and minimum from the time of initial setting, position information that has changed maximum from the time of initial setting, or an average of the 10 times is acquired as the position of calibration patterns CP. Then, by comparing the calculated position and the position information of calibration patterns CP at the time of initial setting described above, the controller acquires the drift amount of the position of electron beam EB. Note that instead of the average of 10 times, controller 60 may acquire the average less than 10 times of moving.

Then, controller 60 calibrates the drift each time the drift amount of the position of electron beam EB is acquired, or calibrates the drift only when the drift amount exceeds a threshold value.

Also, controller 60 acquires the state of change of detection signals of reflected electrons RE from a predetermined calibration pattern CP once in every N times, compares the acquired state of change to the corresponding state of change of the detection signals stored at the time of initial setting, and detects the drift amount of the focus of the electron beam. Then, controller 60 calibrates the drift each time the drift amount of the focus of electron beam EB is acquired by adjusting the current supplied to the focus coil, or calibrates the drift only when the drift amount exceeds a threshold value.

As is described so far, with electron beam exposure apparatus 100 according to the embodiment, since the exposure apparatus is equipped with the plate shaped opening member 16 arranged facing wafer W via a predetermined gap on the wafer W side in the optical axis AX direction (the Z-axis direction) of electron beam optical system 32, with opening 16c formed through which electron beam EB from electron beam optical system 32 passes, this can suppress an adverse effect that the electrical charge accumulated on wafer W by irradiation of electron beam EB has on the irradiation position of electron beam EB when compared to the case when the exposure apparatus is not equipped with opening member 16. Also, in the embodiment, especially since opening member 16 is made of a dielectric (zero expansion ceramic), the adverse effect that the electrical charge accumulated on wafer W by irradiation of electron beam EB has on the irradiation position of electron beam EB can be suppressed more effectively.

Also, as is obvious from FIG. 6, since only reflected electrons RE having a high extraction angle that can pass through opening 16c of opening member 16 are detected and reflected electrons of low energy or reflected electrons that are scattered near stage 22 within exposure chamber 12 are no longer detected when detecting the reflected electrons from alignment marks AM on wafer W with reflected electron detection device 38, as a consequence, S/N ratio when detecting the reflected electrons can be improved.

Also, with electron beam exposure apparatus 100 according to the embodiment, electron beam EB is deflected and scanned with respect to calibration patterns CP on reflection surface 18a formed on the inner bottom surface of the engraved recess section of opening member 16, and by detecting reflected electrons RE generated at calibration patterns CP with reflected electron detection device 38, the drift of position of electron beam EB is detected. Therefore, the drift of position of electron beam EB can be detected, without using the alignment marks on the wafer. Also, with electron beam exposure apparatus 100, controller 60 detects the drift of position of electron beam EB during the stepping operation (during the deceleration and acceleration period in the scanning direction) in between the plus scan and the minus scan in the exposure operation of the wafer. Therefore, it becomes possible to detect the drift of position of electron beam EB and perform calibration of the drift, without decreasing the throughput.

Also, with electron beam exposure apparatus 100, along with detecting the drift of position of electron beam EB, it is possible to detect the drift amount of focus of the electron beam, based on change of detection signals of the reflected electrons from the calibration pattern acquired for detecting the drift of position of electron beam EB, and to perform calibration of the drift of focus of electron beam EB when necessary.

Note that in the embodiment, while the case has been described where the alignment marks formed on wafer W are scanned with the electron beam on the initial setting for calibration of the drift (position and focus) of electron beam EB, the embodiment is not limited to this, and the reference marks provided on stage 22 may be scanned with the electron beam. In such a case, the scan becomes free of the risk of being affected by the electron beam resist coated on wafer W, being affected by defective shapes of alignment, marks, and the like. In this case, a measurement device for measuring the positional relation between the alignment marks and the reference marks, such as for example, a microscope or the like will be necessary.

Modified Example

Next, a modified example of the electron beam exposure apparatus according to the first embodiment will be described. While the electron beam exposure apparatus according to the modified example, as is shown in FIG. 9, differs from the first embodiment previously described on the point that the calibration pattern is not formed on reflection surface 18a of opening member 16, the structure of other parts are similar to the first embodiment previously described.

Figure 9:
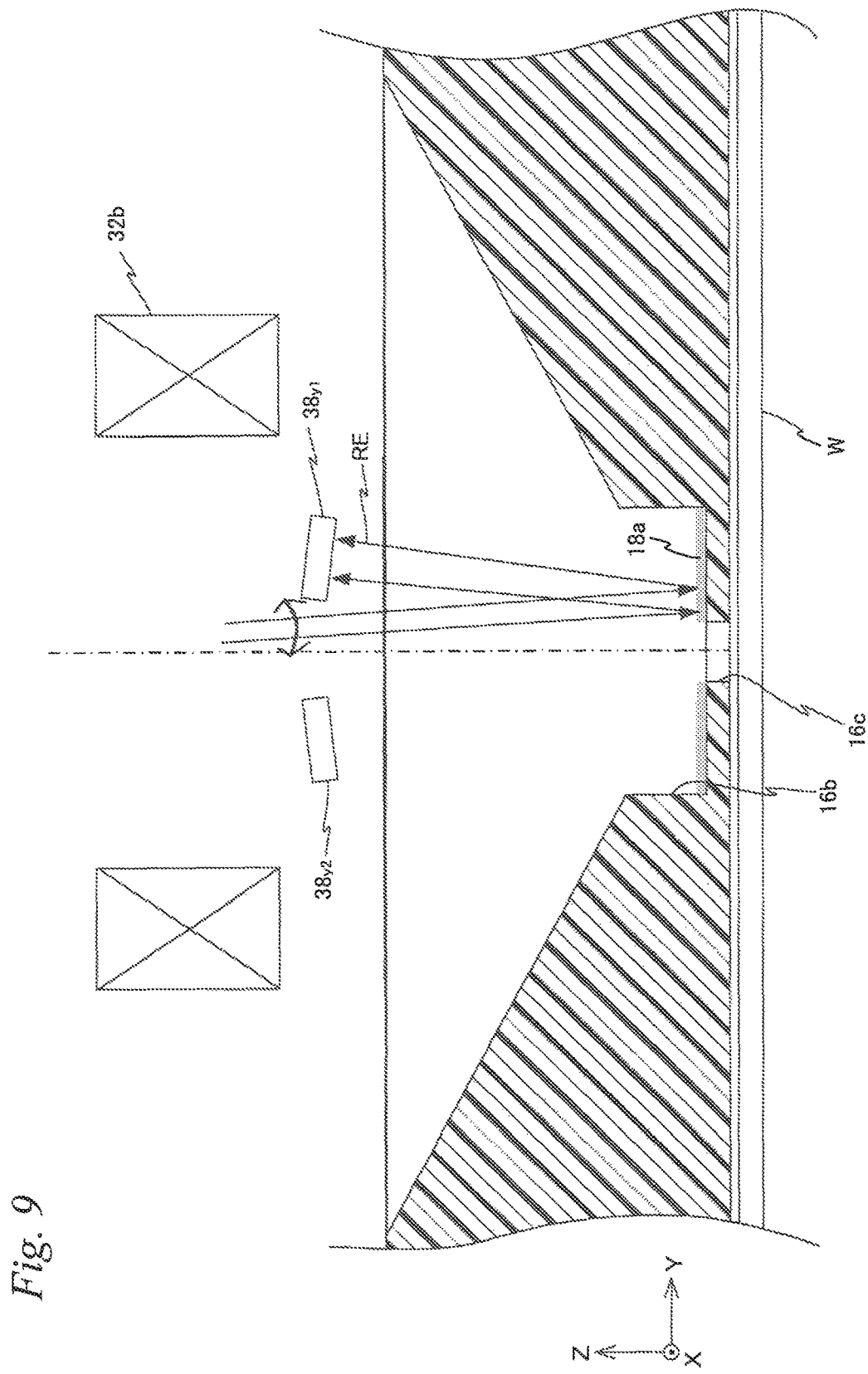
FIG. 9 is a view used to explain a modified example of the first embodiment.

With the electron beam exposure apparatus according to the modified example, as is shown in FIG. 9, controller 60 scans electron beam EB via electron beam deflection control section 66 with respect to reflection surface 18a in a range including a border section with the opening (edge of reflection surface 18a). This allows controller 60 to detect reflected electrons from reflection surface 18a using reflected electron detection devices $38_{x1}$, $38_{x2}$, $38_{y1}$, and $38_{y2}$ and to detect position of the edge of reflection surface 18a with the position of electron beam EB serving as a reference, based on deflection information of electron beam EB obtained from electron beam deflection control section 66 and information on processing results of detection signals of reflection surface 18a obtained from signal processor 62, similar to the detection of position information of calibration pattern CP previously described.

Accordingly, in the modified example, by handling the position of the edge of reflection surface 18a in a manner similar to the position of calibration patterns CP in the embodiment described above, it becomes possible to perform detection of the drift of position of electron beam EB and calibration of the drift in the same way as the embodiment described above. In the modified example, in both initial setting and during stepping operation, as is shown in FIG. 9, controller 60 scans electron beam EB via electron beam deflection control section 66 with respect to reflection surface 18a in a range including the edge of reflection surface 18a.

Also, since detection signals of reflected electrons from reflection surface 18a including the edge are obtained by scanning electron beam EB with respect to reflection surface 18a, it becomes possible to detect drift amount of the focus of the electron beam based on change of the detection signals, and to perform calibration of the drift of the focus of electron beam EB when necessary.

Note that in the first embodiment and the modified example described above, while reflection surface 18a is formed on the upper surface of the bottom wall of engraved recess section 16b of opening member 16, a reflection pattern having a reflectance to electron beam EB different from that of the upper surface may be formed on the upper surface of the bottom wall of recess section 16b, without the reflection surface being formed. In this case, by handling the reflection pattern in a manner similar to the calibration pattern in the embodiment described above, the same working effect can be produced as the embodiment described above.

Note that in the embodiment above, while opening member 16 is supported by metrology frame 40 which supports barrel 34 (electron beam irradiation device 30) having electron beam optical system 32 inside, positional relation between opening member 16 and metrology frame 40 may change by the influence of heat or influence of other factors. Therefore, for example, as is shown in FIG. 7 in a dotted (broken line) block, a measurement device 90 that measures the relative position between metrology frame 40 and opening member 16 may be further provided, and controller 60 may correct the position of electron beam EB based on measurement information of the measurement device.

Note that in the embodiment above, while the case has been described in which opening member 16 is supported by metrology frame 40 supporting barrel 34 (electron beam irradiation device 30) that has electron beam optical system 32 inside, the embodiment is not limited to this, and the positional relation of opening member 16 with electron beam optical system 32 (barrel 34) may be constantly maintained. In this case, measurement device 90 described above may be provided, and by controller 60 or another controller controlling an actuator (not shown), opening member 16 may be driven with respect to metrology frame 40 so that a constant positional relation is maintained between electron beam optical system 32 (barrel 34) supported by metrology frame 40 and opening member 16.

Also, in the embodiment above, while an example was given where position information of stage 22 is measured by encoder system 28 that has grating RG formed on the lower surface (surface on the −Z side) of opening member 16 and four heads 26 provided on the upper surface of stage 22 at the four corners facing the grating, the embodiment is not limited to this, and the position information of stage 22 may be measured by an encoder system in which the grating section (grating) is provided at stage 22 and the heads are provided external to stage 22 in a manner that can face the grating section.

Also, the position measurement device that measures position information of stage 22 is not limited to the encoder system, and a laser interferometer system may also be used.

Second Embodiment

Next, a second embodiment will be described, based on FIG. 10. Here, the same reference codes will be used for component parts identical or similar to electron beam exposure apparatus 100 according to the first embodiment previously described, and the description thereabout will be brief or omitted.

Figure 10:
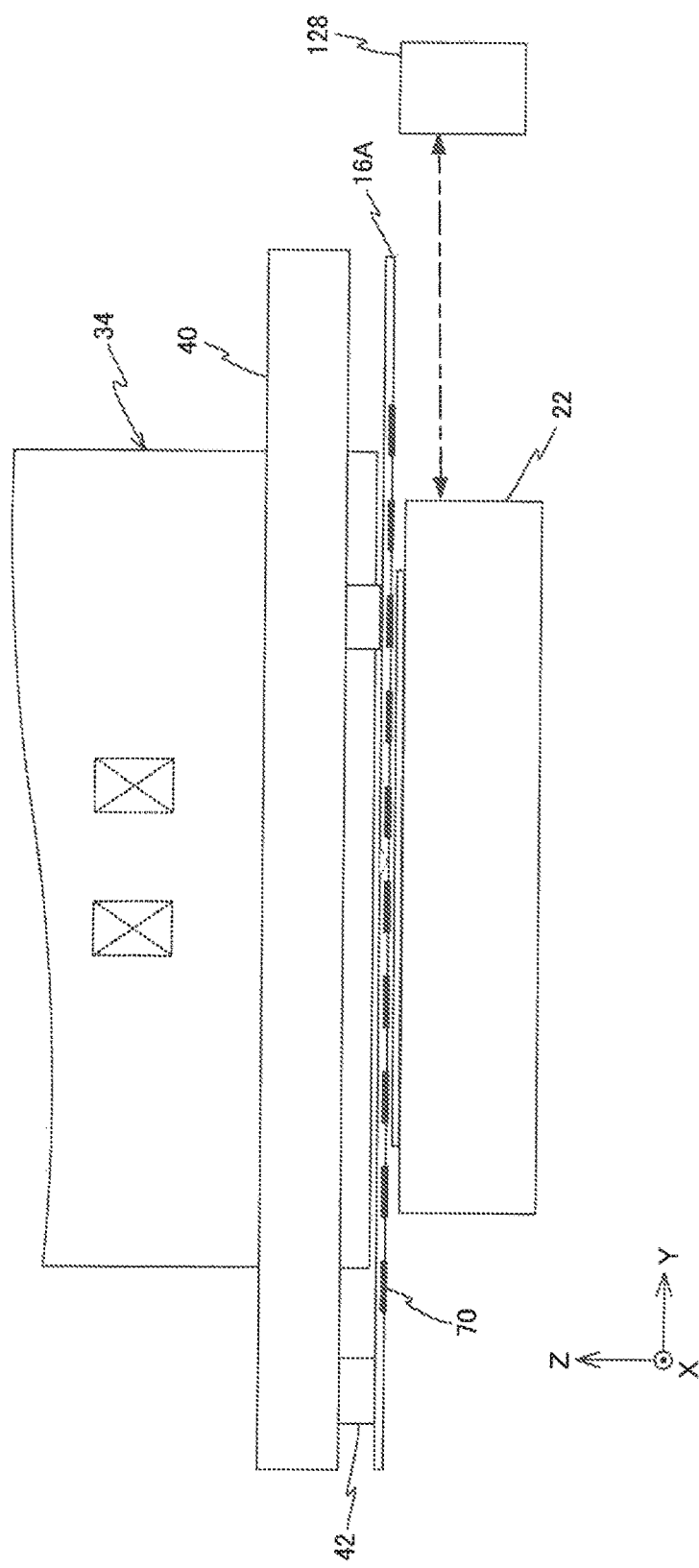
FIG. 10 is a view used to explain a structure of an electron beam exposure apparatus according to a second embodiment.

FIG. 10 shows enlarged the lower end of barrel 34, metrology frame 40, an opening member 16A, and stage 22 that the exposure apparatus according to the second embodiment is equipped with. With the electron beam exposure apparatus according to the second embodiment, opening member 16A is provided instead of opening member 16 previously described and a laser interferometer system 128 is provided instead of encoder system 28, and by laser interferometer system 128, position information of stage 22 that holds wafer W is to be measured in the XY plane in directions of three degrees of freedom or six degrees of freedom. The structure of other parts is similar to electron beam exposure apparatus 100 according to the first embodiment previously described.

Opening member 16A is structured basically similar to opening member 16 previously described, but the following point is different. That is, with opening member 16A, grating RG is not formed on the surface facing wafer W (lower surface, the surface on the −Z side) and a plurality of temperature sensors 70 consisting of, for example, infrared sensors, is arranged in an array in the XY two-dimensional direction. The plurality of temperature sensors is embedded in opening member 16A in a state where the lower surface of the sensors is at a position almost at the same surface as the lower surface of opening member 16A.

Then, controller 60 controls the irradiation position of electron beam EB with respect to wafer W, based on temperature information measured by the plurality of temperature sensors 70 during the exposure operation of wafer W.

With the electron beam exposure apparatus according to the second embodiment, other than being able to obtain the same effect as the first embodiment previously described, controller 60 can control the irradiation position of electron beam EB with respect to wafer W based on the temperature information of wafer W measured by the plurality of temperature sensors without the exposure operation being interrupted, which can make drawing errors of the pattern due to non-linear thermal expansion of the wafer smaller when non-linear expansion of the wafer occurs by the irradiation of electron beam EB.

Third Embodiment

Next, a third embodiment will be described, based on FIG. 11. Here, the same reference codes will be used for component parts identical or similar to the electron beam exposure apparatus according to the first and second embodiments previously described, and the description thereabout will be brief or omitted.

Figure 11:
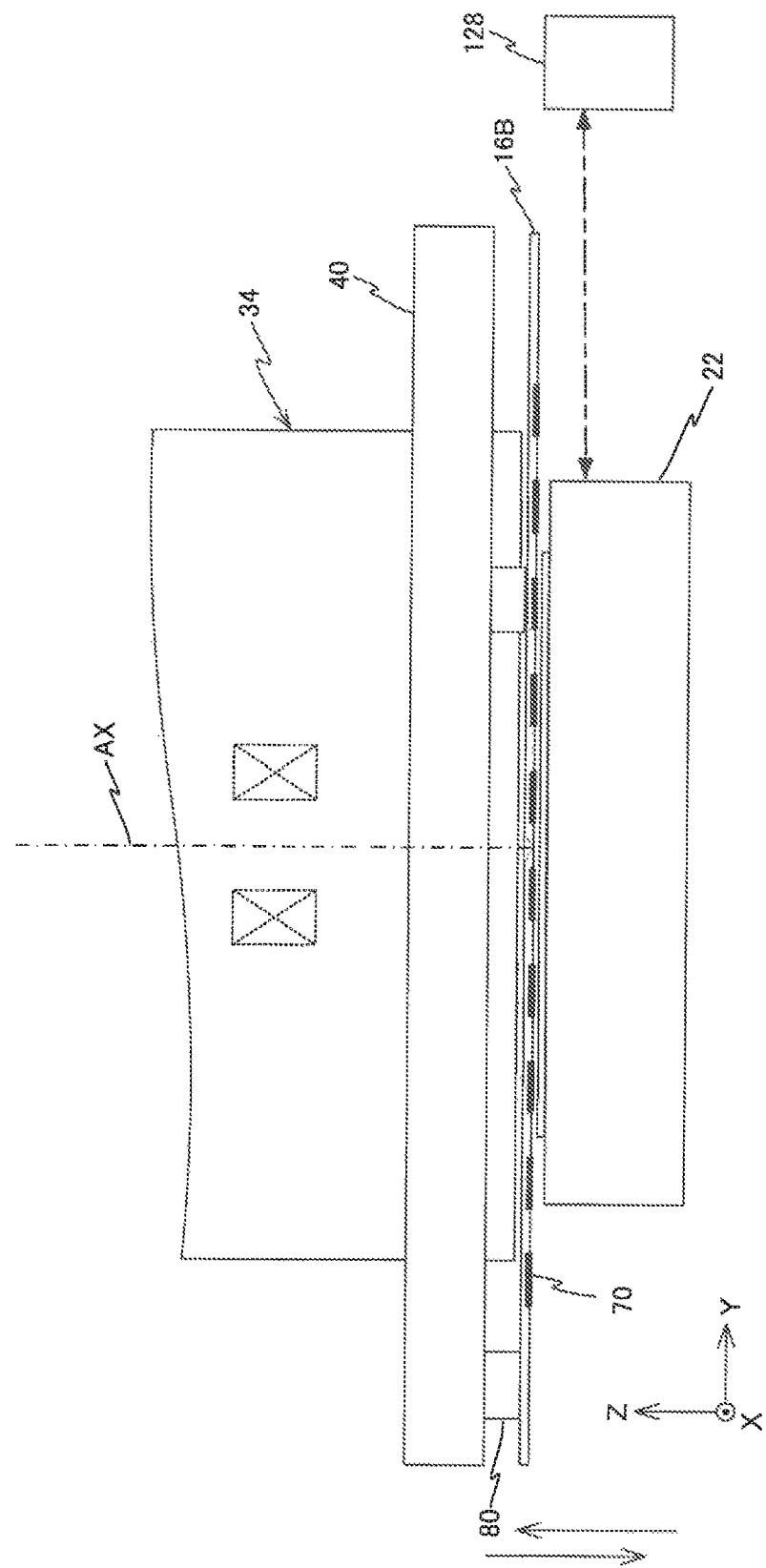
FIG. 11 is a view used to explain a structure of an electron beam exposure apparatus according to a third embodiment.

FIG. 11, similar to FIG. 10, shows enlarged the lower end of barrel 34, metrology frame 40, an opening member 16B, and stage 22 that the electron beam exposure apparatus according to the third embodiment is equipped with. With the electron beam exposure apparatus according to the third embodiment, opening member 16B is provided instead of opening member 16A previously described, and the apparatus is different from the electron beam exposure apparatus according to the second embodiment on the point that opening member 16B is supported by suspension from metrology frame 40 via a plurality of drivers 80 that can drive opening member 16B in a direction (the Z-axis direction) parallel to optical axis AX. The structure of other parts is similar to the electron beam exposure apparatus according to the second embodiment previously described.

Opening member 16B is structured similar to opening member 16A, and other than having a plurality of temperature sensors 70 like opening member 16A, a structure is employed that makes it possible for opening member 16B to cool itself. For example, a liquid flow path can be formed inside opening member 16B, and a structure can be employed in which opening member 16B cools itself by making a cooling liquid flow in the liquid flow path. For example, a circulation system may be employed that makes the cooling liquid cooled in a cooler arranged external to the vacuum chamber flow into the liquid flow path via piping and returns the cooling liquid flowing in the liquid flow path to the cooler via piping.

While thermal conduction (conduction, convection) through air does not occur inside the vacuum chamber since there is no air, it is possible to cool wafer W facing opening member 16B by radiation (emission) with opening member 16B. Also, heat receiving amount by the radiation is inversely proportional to the square of the distance from the heat source. In the case of the third embodiment, temperature rising rate of the wafer is inversely proportional to the square of the distance between opening member 16B and wafer W.

Therefore, in the third embodiment, according to the thermal conduction property by the radiation described above, controller 60 controls drivers 80 so that opening member 16B is moved close to wafer W to a desired distance based on detection results of temperature sensors 70, and cools wafer W to a predetermined temperature. Controller 60 can execute such cooling of wafer W when, for example, during the stepping operation (during deceleration and acceleration in the scanning direction) performed every predetermined times in the exposure operation of the wafer. However, in this case, when detection and calibration of the drift of electron beam EB similar to electron beam exposure apparatus 100 according to the first embodiment previously described is to be performed, because Z position of opening member 16B changes from the time of initial setting at the time of stepping operation when cooling of wafer W is performed, even if detection of reflected electrons from calibration patterns CP previously described is performed, detection results of the reflected electrons cannot be used for detecting the drift of electron beam EB. Accordingly, processing for detection of the drift of electron beam EB should not to be performed at the time of stepping operation when cooling of wafer w is performed, and processing for detection of the drift of electron beam EB has to be performed at the time of stepping operation when cooling of wafer W is not performed, that is, at the time of stepping operation when the Z position of opening member 16B can be set to the position at the time of initial setting.

Note that in the third embodiment described above, since the temperature rise of wafer W due to irradiation of electron beam EB can be acquired in advance by simulation or the like, it is also possible to control driver 80 during the stepping operation previously described to cool wafer W, based on the simulation results. In such a case, the temperature sensors do not necessarily have to be provided. As is obvious from the description here, in the third embodiment, the temperature sensors provided may be one or several.

Also, when no temperature sensors are provided in the third embodiment, instead of opening member 16B, opening member 16 previously described may be used, and instead of laser interferometer system 128, encoder system 28 may be employed.

Note that in the second and third embodiments described above, while opening members 16A and 16B are used on which reflection surface 18a and calibration patterns CP are formed on the upper surface of the inner bottom wall of engraved recess section 16b, the embodiments are not limited to this, and an opening member may be used that has only opening 16c formed without having one of, or both of the reflection surface and the calibration patterns on the upper surface of the inner bottom wall of engraved recess section 16b. That is, an opening member may be used that has opening 16c formed substantially on the optical axis of electron beam optical system 32 and has temperature sensor 70 at a surface facing wafer W.

Note that in each of the embodiments above, instead of opening members 16, 16A, and 16B, the center section including recess section 16a and the remaining section may be structured by separate members. In this case, for example, the center section can be structured by a disc-shaped member having parts similar to recess section 16a previously described in the center of the upper surface, engraved recess section 16b that has at least one of reflection surface 18a and calibration patterns CP formed, and opening 16c.

Also, in each of the embodiments above, since opening members 16, 16A, and 16B are used for calibration of the drift of electron beam EB, in other words, these opening members can also be referred to as calibration members. Also, since reflection surface 18a is formed on opening members 16, 16A, and 16B, in other words, these opening members can also be referred to as reflection members.

Furthermore, since calibration patterns CP are formed on opening members 16, 16A, and 16B, in other words, these opening members can also be referred to as pattern members.

Note that in each of the embodiments above, while the case has been described where the drift of position and the like of electron beam EB is detected by deflecting and scanning electron beam EB with respect to calibration patterns CP on formed on opening member 16, and by detecting reflected electrons RE generated at calibration patterns CP with reflected electron detection device 38, the structure of detecting the drift of position and the like of electron beam EB is not limited to this structure. For example, instead of reflected electron detection device 38, a charged particle detector that directly detects electron beam EB may be used. In this case, the charged particle detector only has to be arranged at the position where calibration patterns CP are formed in opening member 16 previously described, instead of calibration patterns CP.

Here, as the charged particle detector, for example, a first charged particle detector can be used that has a structure in which a plurality of sets of a scintillator section which converts electrons to light and a photoelectric conversion device which converts light generated by the scintillator section to electric signals are arranged. Note that a light guide for guiding the light generated by the scintillator section may be provided in between the scintillator section and the photoelectric conversion device.

In the first charged particle detector, the scintillator section is provided in the periphery of opening 16c of opening member 16 and is equipped with a plurality of scintillators arranged with the first direction or the second direction serving as the periodic direction, and each of the plurality of scintillators is connected to the photoelectric conversion device. As the photoelectric conversion device, for example a photodiode, a photomultiplier tube or the like may be used.

Furthermore, as another detector (a second charged particle detector) to directly detect electron beam EB, a detector having a two-layer structure formed by layering a silicon (Si) thin film and a photodiode may be used. The Si thin film has a plurality of slits formed with periodic directions in the first direction and the second direction, and facing each slit of the Si thin film, photodiodes are provided which allows detection of electron beam EB that passes through each of the slits.

Also by irradiating a target such as wafer W with electron beam EB, there may be cases when electrical charge of opening member 16 occurs. That is, organic matter derived from the resist or the like is adhered to opening member 16, and the electrical charge is accumulated on the organic matter. When electrical charge is accumulated in opening member 16 in this manner, the position of electron beam EB irradiated on wafer W varies due to the influence of the accumulated electrical charge on the electric field. Therefore, to prevent the accumulation of electrical charge in opening member 16, a structure of applying a conductive coating on the surface of opening member 16, and connecting this coating to a ground wire may be employed. The conductive coating is applied to a surface (lower surface) facing wafer W of opening member 16, or to a surface (upper surface) facing electron beam optical system 32. The coating and ground wire are preferably connected at a place distanced from opening 16c to avoid the connection influencing electron beam EB. With this structure, even if the organic matter is adhered to opening member 16, the electrical charge is not accumulated on the organic matter and is carried through the coating to the ground wire, which can reduce the influence on electron beam EB.

Note that instead of providing the conductive coating on the surface of opening member 16, by structuring opening member 16 to be separable into a first part and a second part in a direction orthogonal to the optical axis of electron beam optical system 32, and connecting the first part and the second part in a state with a conductive material in between the first part and the second part, it becomes possible to incorporate a conductive material layer in opening member 16. And by connecting the conductive material layer to the ground wire, even if the organic matter adhered to the surface of opening member 16 is charged, the electrical charge flows to the ground wire through the conductive material layer, therefore, the electrical charge is not accumulated on opening member 16.

A structure of cleaning the organic matter adhered to opening member 10 may be employed to prevent the electrical charge from accumulating on opening member 16. By blowing gas such as ozone on opening member 16 reacting with the organic matter adhered to opening member 16 and making a reaction, opening member 16 can be cleaned. For example, after moving (withdrawing) stage 22 from below opening member 16, a cleaning device, having a supply port that blows gas onto the surface of opening member 16 and a recovery port that recovers the gas that has been blown, only has to be arranged below opening member 16.

Note that it is preferable to employ a structure of opening member 16 to suppress influence of external magnetic field to suppress (prevent) the external magnetic field of electron beam optical system 32 from affecting electron beam EB via opening member 16. For example, a structure may be employed in which the outer periphery of opening member 16 is surrounded by a high magnetic permeability material such as permalloy to make a magnetic shield. In this structure, since the material of the shield has higher magnetic permeability than the material of opening member 16, almost all magnetism from the outside passes through the shield and bypasses opening member 16. Therefore, opening member 16 becomes shielded from the external magnetic field, and it becomes possible to prevent electron beam EB from being affected by the external magnetic field Note that in each of the embodiments above, while examples were given in the case of using a single-column type electron beam optical system 32, the embodiments are not limited to this, and a multi-column type electron beam optical system that has a plurality of optical system columns consisting of multi-beam optical systems previously described may also be used. Also, recess section 16a, engraved recess section 16b, and opening 16c previously described only have to be formed in an arrangement corresponding to the plurality of optical system columns on the upper surface of each of the opening members 16, 16A, and 16B. Also, as the electron beam irradiation device, an electron beam irradiation device employing a method using a variable shaped beam (rectangular beam) can be used in which the electron beam shape is changed into a rectangular shape by making the electron beam pass through a rectangular shaped hole called a forming aperture in several steps.

Note that in each of the embodiments above, while the case has been described where the entire exposure system 20 is housed inside vacuum chamber 10, the embodiments are not limited to this, and of exposure system 20, the part excluding the lower end of barrel 34 of electron beam irradiation device 30 may be exposed outside of vacuum chamber 10.

Note that in each of the embodiments above, while electron beam irradiation device 30 integral with metrology frame 40 are supported in a suspended state from a top plate (ceiling wall) of the vacuum chamber via the three suspension support mechanisms 50a, 50b, and 50c, the embodiments are not limited to this, and electron beam irradiation device may be supported by a floor type body. Also, a structure may be employed in which electron beam irradiation device 30 can move with respect to stage 22.

Note that in each of the embodiments above, while the case has been described where the target is a wafer for manufacturing semiconductor devices, the exposure apparatus according to each of the embodiments may also be suitably applied when producing a mask by forming fine patterns on a glass substrate. Also in each of the embodiments above, while the electron beam exposure apparatus using an electron beam as the charged particle beam is described, each of the embodiments above can also be applied to an exposure apparatus using an ion beam and the like as the charged particle beam for exposure.

Electronic devices such as semiconductor devices (micro devices) are manufactured through steps such as; a step for performing function/performance design of a device, a step for making a wafer from a silicon material, a lithography step for performing exposure (pattern drawing according to a designed pattern data) with respect to a wafer by the electron beam exposure apparatus and the exposure method according to the embodiments or the modified examples previously described, a development step for developing the wafer which has been exposed, an etching step for removing by etching an exposed member of an area other than the area where the resist remains, a resist removing step for removing the resist that is no longer necessary since etching has been completed, a device assembly step (including a dicing process, a bonding process, and a package process), and an inspection step. In this case, in the lithography step, since the exposure method described so far is executed using the exposure apparatus of the embodiments above and the device pattern is formed on the wafer, micro devices with high integration can be produced with good productivity.

Note that the disclosures of all publications, international publications, U.S. Patent Application Publications, and U.S. Patents related to the exposure apparatus and the like quoted in each of the embodiments above, in their entirety, are incorporated herein by reference as a part of the present specification.

INDUSTRIAL APPLICABILITY

As is described so far, the charged particle beam irradiation apparatus according to the present invention is suitable for use in a lithography process when manufacturing electronic devices such as semiconductor devices. Also, the device manufacturing method of the present invention is suitable for manufacturing micro devices.

REFERENCE SIGNS LIST

16 . . . opening member,
16c . . . opening,
18a . . . reflection surface,
22 . . . stage,
26 . . . head,
32 . . . electron beam optical system,
38 . . . reflected electron detection device,
40 . . . metrology frame,
60 . . . controller, 70 . . . temperature sensor,
80 . . . driver,
90 . . . measurement device,
100 . . . electron beam exposure apparatus,
AX . . . optical axis,
EB . . . electron beam,
CP . . . calibration pattern,
RG . . . grating,
W . . . wafer.

The invention claimed is:

1. A charged particle beam irradiation apparatus to irradiate a target with a charged particle beam, the irradiation apparatus comprising:
a stage configured to hold the target;
a charged particle beam optical system configured to irradiate the target with the charged particle beam;
a charged particle detection device, which is disposed at an emitting side of the charged particle beam of the charged particle beam optical system; and
a reflection member disposed between the stage and a final lens of the charged particle beam optical system, the reflection member being separate from the stage and the target, wherein
the charged particle detection device is configured to detect charged particles reflected from the reflection member, and
the target and the charged particle beam and relatively moved so that the target is irradiated with the charged particle beam.

2. The charged particle beam irradiation apparatus according to claim 1, wherein
the reflection member has a reflection pattern to reflect the charged particle beam.

3. The charged particle beam irradiation apparatus according to claim 1, wherein
the reflection member is arranged at a position spaced from an optical axis of the charged particle beam optical system in a direction intersecting the optical axis.

4. The charged particle beam irradiation apparatus according to claim 3, further comprising:
a controller configured to control the charged particle beam optical system to deflect the charged particle beam toward the reflection member.

5. The charged particle beam irradiation apparatus according to claim 4, wherein
the charged particle detection device is arranged between the charged particle beam optical system and the reflection member.

6. The charged particle beam irradiation apparatus according to claim 1, further comprising:
an opening member arranged between the emitting side of the charged particle beam of the charged particle beam optical system and the target, having an opening through which the charged particle beam passes, and the reflection member is provided at the opening member.

7. The charged particle beam irradiation apparatus according to claim 6, wherein
at least a part of the opening member is structured by a dielectric.

8. The charged particle beam irradiation apparatus according to claim 6, wherein
the opening member has a positional relation constantly maintained with the charged particle beam optical system.

9. The charged particle beam irradiation apparatus according to claim 6, wherein the opening member is supported by a frame supporting the charged particle beam optical system.

10. The charged particle beam irradiation apparatus according to claim 9, further comprising:
a measurement device configured to measure a relative position between the frame and the opening member.

11. The charged particle beam irradiation apparatus according to claim 6, further comprising:
an adjustment device configured to adjust a positional relation between the opening member and the charged particle beam optical system.

12. The charged particle beam irradiation apparatus according to claim 1, further comprising:
a detection device configured to detect drift of the charged particle beam, based on detection results of the charged particle detection device.

13. The charged particle beam irradiation apparatus according to claim 12, wherein
a controller controls the charged particle beam optical system to irradiate the target with the charged particle beam after correcting the drift based on a detection made by the detection device.

14. The charged particle beam irradiation apparatus according to claim 13, wherein
a controller acquires the drift detected by the detection device, the drift being of at least one of position of the charged particle beam and focus of the charged particle beam.

15. A charged particle beam irradiation apparatus to irradiate a target with a charged particle beam, the irradiation apparatus comprising:
a stage configured to hold the target;
a charged particle beam optical system configured to irradiate the target with the charged particle beam;
an opening member, which is arranged at an emitting side of the charged particle beam of the charged particle beam optical system, having an opening through which the charged particle beam passes;
a charged particle detection device, which is disposed at an emitting side of the charged particle beam of the charged particle beam optical system; and
a reflection member disposed between the stage and a final lens of the charged particle beam optical system, the reflection member being separate from the stage and the target, wherein
the charged particle detection device is configured to detect charged particles reflected from the reflection member, and
the target and the charged particle beam are relatively moved so that the target is irradiated with the charged particle beam.

16. The charged particle beam irradiation apparatus according to claim 15, wherein
at least a part of the opening member is structured by a dielectric.

17. The charged particle beam irradiation apparatus according to claim 15, wherein
the opening member has a positional relation constantly maintained with the charged particle beam optical system.

18. The charged particle beam irradiation apparatus according to claim 15, wherein
the opening member is supported by a frame supporting the charged particle beam optical system.

19. The charged particle beam irradiation apparatus according to claim 18, further comprising:

a part of a position measurement device configured to measure position information of the stage provided in the opening member.

20. The charged particle beam irradiation apparatus according to claim 19, wherein
the position measurement device is an encoder system having (i) a grating section provided at one of the stage and the opening member, and (ii) a head section provided at the other of the stage and the opening member and configured to (a) face the grating section, (b) irradiate the grating section with a beam and (c) receive a return beam from the grating section.

21. The charged particle beam irradiation apparatus according to claim 18, further comprising:
a measurement device configured to measure relative position between the frame and the opening member.

22. The charged particle beam irradiation apparatus according to claim 15, further comprising:
an adjustment device configured to adjust a positional relation between the opening member and the charged particle beam optical system.

23. The charged particle beam irradiation apparatus according to claim 15, wherein
the charged particle detection device is arranged at a position where a reflection charged particle from the target can be incident thereon, via the opening of the opening member.

24. The charged particle beam irradiation apparatus according to claim 23, wherein
the reflection member is provided in at least a part of a periphery of the opening.

25. The charged particle beam irradiation apparatus according to claim 24, wherein
a reflection surface of the reflection member includes an edge part dividing the opening, the apparatus further comprising:
a detection device configured to detect drift of the charged particle beam, based on results of detecting a reflection charged particle generated at the reflection surface by scanning the reflection surface with the charged particle beam, using the charged particle detection device.

26. The charged particle beam irradiation apparatus according to claim 25, wherein
a controller acquires the drift detected by the detection device, the drift being of at least one of position of the charged particle beam and focus of the charged particle beam.

27. The charged particle beam irradiation apparatus according to claim 23, wherein
the reflection member has a reflection pattern configured to reflect the deflected charged particle beam.

28. The charged particle beam irradiation apparatus according to claim 27, further comprising:
a detection device configured to detect drift of the charged particle beam, based on results of detecting a reflection charged particle generated at the reflection member by scanning the reflection member with the charged particle beam, using the charged particle detection device.

29. The charged particle beam irradiation apparatus according to claim 28, wherein
a controller acquires the drift detected by the detection device, the drift being of at least one of position of the charged particle beam and focus of the charged particle beam.

30. The charged particle beam irradiation apparatus according to claim 15, further comprising:
a plurality of temperature sensors arranged on a surface of the opening member facing the target and configured to measure temperature of the target at different positions within a surface.

31. The charged particle beam irradiation apparatus according to claim 30, further comprising:
a controller configured to control irradiation position of the charged particle beam with respect to the target, based on temperature information measured by the plurality of temperature sensors.

32. The charged particle beam irradiation apparatus according to claim 15, wherein
the opening member also serves as a cooling member configured to cool the target by radiation, the apparatus further comprising:
a driver configured to move the opening member in a direction parallel to an optical axis of the charged particle beam optical system; and
a controller configured to control the driver.

33. The charged particle beam irradiation apparatus according to claim 32, wherein
the controller is configured to control the driver, based on detection results of temperature sensors.

34. The charged particle beam irradiation apparatus according to claim 15, wherein
the opening member serves as a cooling member configured to cool the target.

35. The charged particle beam irradiation apparatus according to claim 1, further comprising:
a controller which controls the charged particle beam optical system based on detection results of the charged particle detection device obtained by irradiating the reflection member with the charged particle beam.

36. The charged particle beam irradiation apparatus according to claim 35, wherein
the controller obtains position information of the charged particle beam emitted from the charged particle beam optical system based on the detection results of the charged particle detection device.

37. The charged particle beam irradiation apparatus according to claim 36, wherein
the position information of the charged particle beam includes a position of the charged particle beam in a direction intersecting an optical axis of the charged particle beam optical system.

38. The charged particle beam irradiation apparatus according to claim 36, wherein
the position information of the charged particle beam includes a focus position of the charged particle beam.

39. The charged particle beam irradiation apparatus according to claim 34, further comprising:
a controller which controls the charged particle beam optical system based on detection results of the charged particle detection device; and
a reference member provided on the stage, wherein
the charged particle detection device detects charged particles generated from the reference member, and
the controller controls the charged particle beam optical system based on the detection results of the charged particle detection device obtained by irradiating the reflection member with the charged particle beam and obtained by irradiating the reference member with the charged particle beam.

40. The charged particle beam irradiation apparatus according to claim 35, wherein the charged particle beam optical system includes a deflection control device to deflect the charged particle beam, and the controller controls the deflection control device to change a deflection state from one of a first state and a second state to the other, the charged particle beam being deflected toward the reflection member in the first state and the charged particle beam being deflected toward the target in the second state.

41. The charged particle beam irradiation apparatus according to claim 1, further comprising:

a temperature sensor provided above the stage, which measures temperature of the target.

42. The charged particle beam irradiation apparatus according to claim 1, wherein the target includes a wafer.

\* \* \* \* \*